United States Patent
Taniuchi et al.

(10) Patent No.: US 9,231,552 B2
(45) Date of Patent: Jan. 5, 2016

(54) RF FRONT-END MODULE AND MOBILE WIRELESS TERMINAL

(71) Applicant: Sony Corporation, Tokyo (JP)

(72) Inventors: Hirotada Taniuchi, Tokyo (JP); Hideaki Shoji, Tokyo (JP); Takaki Kanno, Tokyo (JP); Katsunori Ishimiya, Tokyo (JP)

(73) Assignee: Sony Corporation, Tokyo (JP)

( * ) Notice: Subject to any disclaimer, the term of this patent is extended or adjusted under 35 U.S.C. 154(b) by 7 days.

(21) Appl. No.: 14/324,906

(22) Filed: Jul. 7, 2014

(65) Prior Publication Data

US 2015/0018043 A1 Jan. 15, 2015

Related U.S. Application Data

(60) Provisional application No. 61/844,158, filed on Jul. 9, 2013.

(51) Int. Cl.
*H04B 1/44* (2006.01)
*H04M 1/00* (2006.01)
*H03H 7/46* (2006.01)
*H03H 7/38* (2006.01)
*H04B 1/00* (2006.01)
*H04B 1/18* (2006.01)
*H04B 1/525* (2015.01)

(52) U.S. Cl.
CPC .............. *H03H 7/465* (2013.01); *H03H 7/38* (2013.01); *H04B 1/006* (2013.01); *H04B 1/18* (2013.01); *H04B 1/525* (2013.01)

(58) Field of Classification Search
CPC .... H04B 1/0053; H04B 1/0057; H04B 1/006; H04B 1/44; H04B 1/48; H04B 1/401; H04B 1/406; H03H 7/38; H03H 7/40; H03H 11/28; H03H 2007/386; H04M 1/0202
USPC .................. 455/78, 83, 552.1, 553.1
See application file for complete search history.

(56) References Cited

U.S. PATENT DOCUMENTS

| | | | | |
|---|---|---|---|---|
| 5,754,141 A * | 5/1998 | Thompson | ............. | H01Q 1/244 455/289 |
| 6,526,263 B1 * | 2/2003 | Saito | ............. | H01Q 1/242 455/83 |
| 6,845,126 B2 * | 1/2005 | Dent | ............. | H03F 3/24 455/73 |
| 6,862,432 B1 * | 3/2005 | Kim | ............. | H04B 1/18 455/83 |
| 8,649,740 B2 * | 2/2014 | Lin | ............. | H04B 1/48 455/78 |
| 8,933,858 B2 * | 1/2015 | Sabouri | ............. | H01Q 1/50 343/850 |
| 2014/0073268 A1 | 3/2014 | Taniuchi et al. | | |

* cited by examiner

*Primary Examiner* — Quochien B Vuong
(74) *Attorney, Agent, or Firm* — Oblon, McClelland, Maier & Neustadt, L.L.P.

(57) ABSTRACT

An electronic device including a first reception band pass filter having a first reception frequency set as a passband; a second reception band pass filter having a second reception frequency set as a passband; a first matching circuit having a first end connected to an antenna terminal; a first switch having a first end connected to a second end of the first matching circuit; a second switch having a first end connected to the second end of the first matching circuit; a second matching circuit connected between a second end of the first switch and the first reception band pass filter; and a third matching circuit connected between a second end of the second switch and the second reception band pass filter, wherein at least one of the first, second, and third matching circuits is a variable matching circuit having a controllable matching constant.

22 Claims, 17 Drawing Sheets

FIG. 17

| # | OPERATION FREQUENCY BAND | SW 21 | SW 22 | SW 23 | SW 24 | SW 25 | SW 26 | SW 27 | SW 115 | SW 351 | SW 352 | SW 51 | SW 52 | SW 53 | SW 54 | SW 55 | SW 56 | SW 57 | VARIABLE CAPACITOR 33a |
|---|---|---|---|---|---|---|---|---|---|---|---|---|---|---|---|---|---|---|---|
| 1 | B#1Rx1, B#1Tx | ON | OFF | OFF | OFF | OFF | OFF | OFF | OFF | OFF | OFF | ON | OFF | OFF | OFF | OFF | OFF | OFF | STATE 0 |
| 2 | B#2Rx1, B#2Tx | OFF | OFF | ON | OFF | OFF | OFF | OFF | OFF | OFF | OFF | OFF | OFF | ON | OFF | OFF | OFF | OFF | STATE 0 |
| 3 | B#3Rx1, B#3Tx | OFF | OFF | OFF | OFF | ON | OFF | OFF | OFF | OFF | OFF | OFF | OFF | OFF | OFF | ON | OFF | OFF | STATE 0 |
| 4 | B#1Rx1+B#2Rx1, B#1Tx OR B#2Tx OR B#1Tx+B#2Tx | ON | OFF | ON | OFF | OFF | OFF | OFF | OFF | OFF | OFF | ON | OFF | ON | OFF | OFF | OFF | OFF | STATE 1 |
| 5 | B#1Rx1+B#3Rx2, B#1Tx | ON | OFF | OFF | OFF | OFF | OFF | OFF | ON | OFF | OFF | ON | OFF | OFF | OFF | OFF | OFF | OFF | STATE 0 |
| 6 | B#2Rx1+B#3Rx3, B#2Tx | OFF | ON | ON | OFF | OFF | ON | OFF | OFF | OFF | OFF | OFF | OFF | ON | OFF | OFF | OFF | OFF | STATE 2 |
| 7 | B#1Rx2+B#3Rx1, B#3Tx | OFF | OFF | OFF | OFF | ON | OFF | ON | OFF | ON | OFF | OFF | ON | OFF | OFF | ON | OFF | OFF | STATE 0 |
| 8 | B#2Rx2+B#3Rx1, B#3Tx | OFF | OFF | OFF | ON | ON | OFF | OFF | OFF | OFF | ON | OFF | OFF | OFF | ON | ON | OFF | ON | STATE 0 |
| 9 | B#1 UNUSED, B#2 UNUSED, B#3 UNUSED | OFF | OFF | OFF | OFF | OFF | OFF | OFF | OFF | OFF | OFF | OFF | OFF | OFF | OFF | OFF | OFF | OFF | STATE 0 |

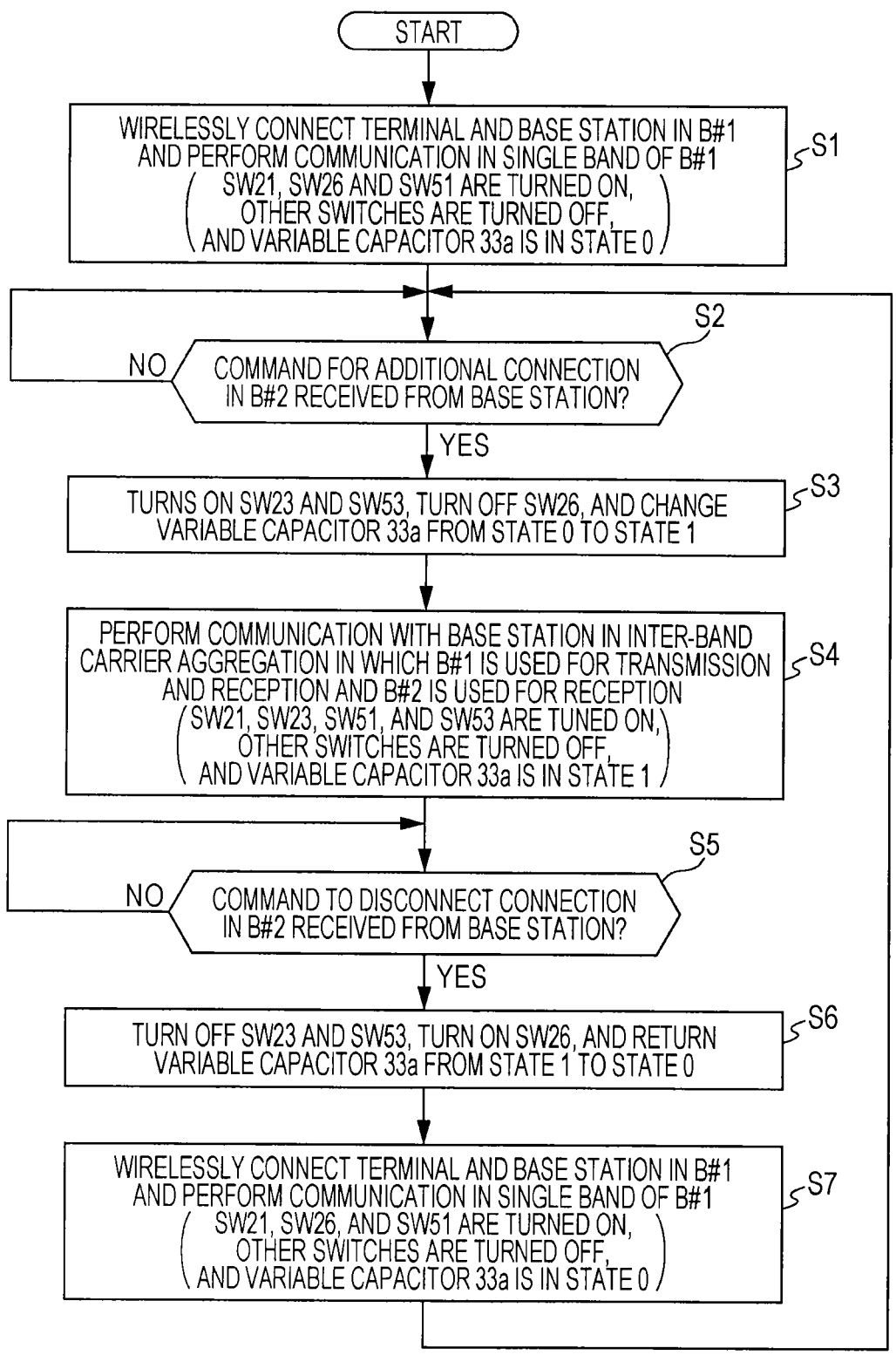

RF FRONT-END MODULE AND MOBILE WIRELESS TERMINAL

CROSS REFERENCE TO RELATED APPLICATION

The present application claims the benefit of the earlier filing date of U.S. Provisional Patent Application Ser. No. 61/844,158 filed on Jul. 9, 2013, the entire contents of which is incorporated herein by reference.

BACKGROUND

1. Field of the Disclosure

The present disclosure relates to an RF front-end module that performs mobile communication and to a wireless terminal having the RF front-end module.

2. Description of Related Art

In a conventional mobile communication system that uses a frequency division duplex (FDD) system in which a frequency domain to be used is divided into a domain for transmission and a domain for reception and transmission and reception are carried out concurrently, an uplink (UL) frequency band and a downlink (DL) frequency band have been fixedly paired. In U.S. Pat. No. 7,729,724 and U.S. Patent Application Publication No. 2002/0090974, for example, an RF front end used in an FDD system is disclosed. Conventional mobile communication systems of this type include, for example, a universal mobile telecommunications system (UMTS) and a frequency division duplex long term evolution (FDD-LTE).

FIG. 1 illustrates an example of three band pairs, B1, B3 and B4, as an example of pairs of frequency bands (band pairs) in an FDD system. Each band pair is a combination of a frequency for transmission (Tx) equivalent to uplink communication and a frequency for reception (Rx) equivalent to downlink communication.

By contrast, in a next-generation mobile communication system called LTE-Advanced, a technology called carrier aggregation (CA) is used. Carrier aggregation is a technology that combines a plurality of frequency carriers to expand frequency bands and improve communication speeds. In this technology, inter-band carrier aggregation is available which is an operation in which, for example, a frequency band for transmission (Tx) and a frequency band for reception (Rx) that constitute one band pair illustrated in FIG. 1 are combined with another frequency band.

When a plurality of frequency bands are combined as described above, not only can a wide frequency band be allocated but vertically asymmetrical operations become possible by combining split frequency bands or combining isolated frequency bands, enabling frequency bands to be efficiently used.

FIG. 2 illustrates an example of the structure of an existing RF front-end module that is ready for inter-band carrier aggregation.

The RF front-end module 50, which is placed between an antenna 101 and an RF transceiver 200, is a unit that performs filtering for out-of-band signals of RF signals, filter selection, and the like. The RF front-end module 50 internally includes a switch unit 10, a diplexer 20, and duplexers 131 to 134 (DUP#1 to DUP#4). The switch unit 10 includes RF switches 111 to 113.

The RF switch 111, which is placed between the diplexer 20 and the antenna 101, electrically connects or breaks a route between the diplexer 20 and the antenna 101 by being controlled to be turned on and off. The RF switch 112, which is placed between the duplexer 133 and the antenna 101, electrically connects or breaks a route between the duplexer 133 and the antenna 101 by being controlled to be turned on and off. The RF switch 113, which is placed between the duplexer 134 and the antenna 101, electrically connects or breaks a route between the duplexer 134 and the antenna 101 by being controlled to be turned on and off.

The diplexer 20 functions so as to split a frequency band to be used between the duplexer 131 and the duplexer 132.

Since, in a FDD system, transmission and reception are performed concurrently, the duplexers 131 to 134 each function so as to provide an isolation between the transmission (Tx) frequency band and the reception (Rx) frequency band, which are paired, so that a transmission (Tx) signal and a reception (Rx) signal do not mutually interfere.

As illustrated in FIG. 3, the duplexer 131 is formed with, for example, a band-pass filter (transmission BPF) 412 that selectively passes signals in the transmission (Tx) frequency band, a band-pass filter (reception BPF) 413 that selectively passes signals in the reception (Rx) frequency band, and a phase circuit (phase shifter) 411 connected in series with the reception BPF 413. The phase circuit 411 is structured (designed) so that a mutual relationship between frequency characteristics of the two filters becomes appropriate in the setting of a matching circuit and line length. This prevents transmission signals and other unnecessary signals from entering the reception side, enabling transmission and reception signals to be preferably split. The matching circuit may be generally formed with an inductor or a capacitor. The phase circuit 411 may be provided not only on the same side as the reception BPF 413 but also on the same side as the transmission BPF 412.

Referring again to FIG. 2, the RF transceiver 200 has power amplifiers 211 to 214, which are respectively connected to the duplexers 131 to 134. The input ends of the power amplifiers 211 to 214 are respectively transmission ports #1 to #4 of a known transmission circuit (not illustrated) provided in the RF transceiver 200. The RF transceiver 200 also has reception ports #1 to #4, which are respectively connected to the duplexers 131 to 134. Known reception circuits (not illustrated) that include low-noise amplifiers (LNAs) 221 to 224 are connected to the reception ports #1 to #4.

FIG. 4 is a graph used to explain the action of a duplexer. The horizontal axis of the graph represents frequencies [MHz], and its vertical axis represents the amount of signal attenuation [dB]. A waveform Wt indicates frequency characteristics that represent how a signal proceeding from the transmission port of the duplexer to an antenna terminal is attenuated. A waveform Wr indicates frequency characteristics that represent how a signal proceeding from the antenna terminal of the duplexer to a reception port is attenuated.

An area A1 of the waveform Wt indicates a low insertion loss in a transmission frequency band, indicating that the efficiency of transmission electric power is superior. An area A2 of the waveform Wr indicates a low insertion loss in a reception frequency band, indicating that reception sensitivity is superior.

An area A3 of the waveform Wr indicates that a wraparound from the transmission signal to the reception side is suppressed by the duplexer and deterioration in reception sensitivity due to the transmission signal is thereby suppressed. Similarly, an area A4 of the waveform Wt indicates that it is suppressed by the duplexer that noise generated from the power amplifier enters the reception side and reception sensitivity is thereby deteriorated.

In the structure illustrated in FIG. 2, when a single band pair (one transmission frequency band and one reception frequency band) is used, the RF switch 112, which is connected to the duplexer 133 connected to the transmission port #3 and reception port #3, for example, is turned on and the other RF switches are turned off. Alternatively, the RF switch 113, which is connected to the duplexer 134 connected to the transmission port #4 and reception port #4, is turned on and the other RF switches are turned off.

In the structure in FIG. 2, if an operation is performed in inter-band carrier aggregation of two downlink waveforms (2 DL) and one uplink (1 UL), the RF switch 111 connected to the diplexer 20 is turned on and the other RF switches are turned off. At this time, the transmission port #1 is used for transmission and the reception ports #1 and #2 are used for reception, for example.

SUMMARY

In the structure of the conventional RF front-end module described above, however, inter-band carrier aggregation is limited to combinations of frequency bands that can be split by the diplexer. If the number of combinations in inter-band carrier aggregation is increased, the problem arises that the structure of the RF front-end module become complex because, for example, a plurality of diplexers are combined. That is, if a diplexer is used, inter-band carrier aggregation can be achieved only with combinations of frequency bands that can be split by the diplexer.

Although a diplexer can be used with a combination of frequency bands in which their frequencies are apart from each other, a difficulty arises when frequencies close to each other are combined. This is because a laminate filter used by the diplexer has a smooth (not abrupt) attenuation/frequency relationship in a range from a passband to an attenuation band.

In addition, the use of the diplexer deteriorates the characteristics of the RF front-end module by an amount equal to the insertion loss of the diplexer.

As seen from FIG. 4, it is difficult for an RF front-end module using a duplexer to adequately attenuate signals in an area outside the passband. Therefore, there has been a case in which it is difficult to achieve both a reduction in insertion loss in the passband and adequate attenuation in an area outside the passband.

In the conventional FDD system, bands to be paired for transmission and reception has been fixedly determined, so attenuation focused on frequency bands corresponding to these bands has been sufficient. In inter-band carrier aggregation, however, transmission signals with frequencies outside the paired bands arrive, so the amount of attenuation must be assured in a plurality of frequency bands. As a result, there has been the problem that the degree of difficulty in designing the duplexer is high, its size is enlarged, and the insertion loss in the passband is increased.

To address this situation, the present disclosure has been devised. The inventor recognizes the need to provide an RF front-end module in an FDD system that has a simple structure but can achieve inter-band carrier aggregation with a small insertion loss.

An RF front-end module in an FDD system according to an embodiment of the present disclosure includes a first reception band pass filter having a first reception frequency set as a passband; a second reception band pass filter having a second reception frequency set as a passband; a first matching circuit having a first end connected to an antenna terminal; a first switch having a first end connected to a second end of the first matching circuit: a second switch having a first end connected to the second end of the first matching circuit; a second matching circuit connected between a second end of the first switch and the first reception band pass filter; and a third matching circuit connected between a second end of the second switch and the second reception band pass filter, wherein at least one of the first, second, and third matching circuits is a variable matching circuit having a controllable matching constant.

In a first operation mode, for example, only the first RF switch is turned on and the second RF switch is turned off. In a second operation mode, only the second RF switch is turned on and the first RF switch is turned off. In a third operation mode, both RF switches are turned on. Switching of the matching constants of the first to third matching circuits is controlled according to switching among the first, second, and third operation mode.

A mobile wireless terminal in an embodiment of the present disclosure has an RF front-end module in an FDD system, as described above, that is connected to an antenna, an RF transceiver, which connected to the RF front-end module and has a transmission circuit and a reception circuit, performs transmission and reception processing for high-frequency signals, and a base-band processing unit, which is connected to the RF transceiver, performs base-band processing.

BRIEF DESCRIPTION OF DRAWINGS

FIG. 17 is a drawing used to explain the operation of the RF front-end module in FIG. 16.

FIG. 18 is a flowchart illustrating an example of the operation of a mobile wireless terminal having the RF front-end module illustrated in FIG. 16.

DETAILED DESCRIPTION

Embodiments of the present disclosure will be described below in detail.

Figure 5:
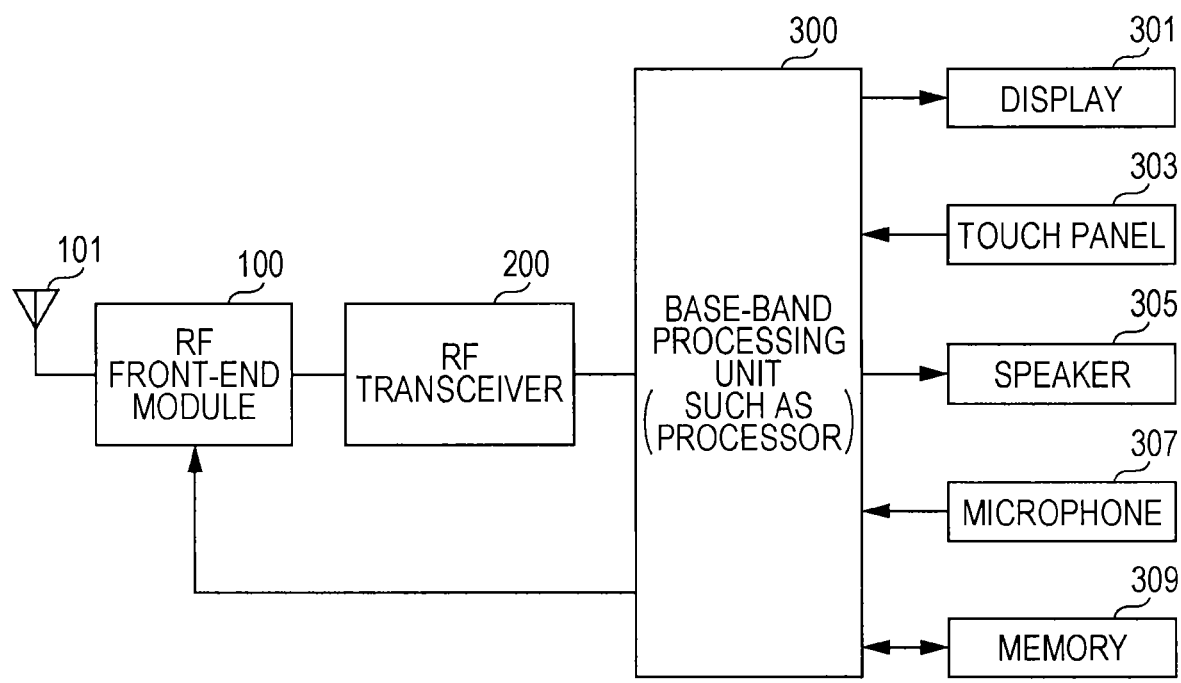
FIG. 5 is a block diagram illustrating the structure of a mobile wireless terminal that uses an RF front-end module in an embodiment of the present disclosure.

FIG. 5 is a block diagram illustrating the structure of a mobile wireless terminal that uses an RF front-end module in this embodiment. FIG. 5 illustrates the basic structure of a mobile wireless terminal such as a so-called smart phone. The mobile wireless terminal may include elements other than those not illustrated. The mobile wireless terminal is not limited to a smart phone; the mobile wireless terminal may be any apparatus, having a wireless communication function that utilizes an RF front end module.

The mobile wireless terminal includes an antenna 101, an RF front-end module 100, an RF transceiver 200, a base-band processing unit 300, a display 301, a touch panel 303, a speaker 305, a microphone 307, and a memory 309.

The antenna 101 is an element for transmitting and receiving radio waves in a frequency band used by the mobile wireless terminal. Although a single antenna is illustrated in the drawing, a plurality of antennas may be provided.

The RF front-end module 100, which is placed between the antenna 101 and the RF transceiver 200, is a unit that performs filtering for out-of-band signals of RF signals, filter selection, and the like. Its specific example will be described later.

The RF transceiver 200, which has a transmission circuit including a power amplifier and the like, a reception circuit including a low-noise amplifier, an oscillator, and the like, performs transmission and reception processing for high-frequency signals.

The base-band processing unit 300, which includes a processing unit, such as a processor, that performs digital signal processing on base-band signals, executes processing necessary for the mobile wireless terminal and controls individual units. The base-band processing unit 300 also functions a control unit that operates the RF front-end module 100 in any one of a plurality of operation modes by controlling various RF switches in the RF front-end module 100 so as to turn on and off them.

The display 301, which is connected to the base-band processing unit 300, has a display device that provides a display interface to the user.

The touch panel 303, which is usually attached to the display 301, has a touch input device that is connected to the base-band processing unit 300 and provides an input interface to the user.

The speaker 305 is an element that converts a voice signal given from the base-band processing unit 300 to an acoustic wave. The microphone 307 converts the acoustic wave to an electric signal corresponding to the acoustic wave and input the electric signal to the base-band processing unit 300.

The memory 309 is a storage unit used by the processor and the like in the base-band processing unit 300 as a storage area and a working area.

The RF front-end module 100 may be integrally structured as an integrated circuit or may be structured as individual parts.

Figure 6:
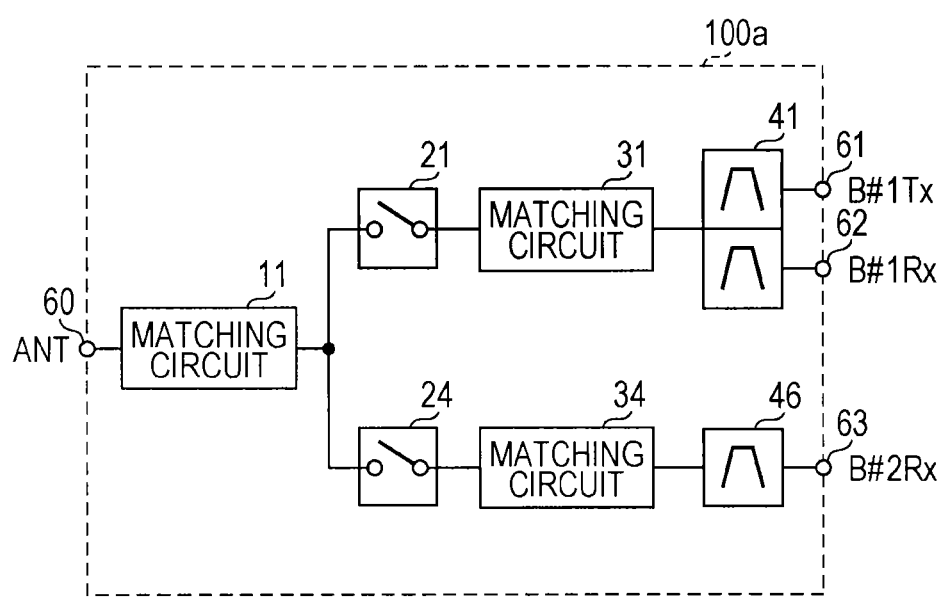
FIG. 6 is a drawing illustrating the basic structure of the RF front-end module in an embodiment of the present disclosure.

FIG. 6 illustrates the basic structure of an RF front-end module 100a in this embodiment. This structure is to achieve inter-band carrier aggregation of frequency band #1 (B#1) and frequency band #2 (B#2).

The RF front-end module 100a is structured with matching circuits 11, 31, and 34, RF switches 21 and 24, a duplexer 41, and a band-pass filter (BPF) 46.

Figure 1:
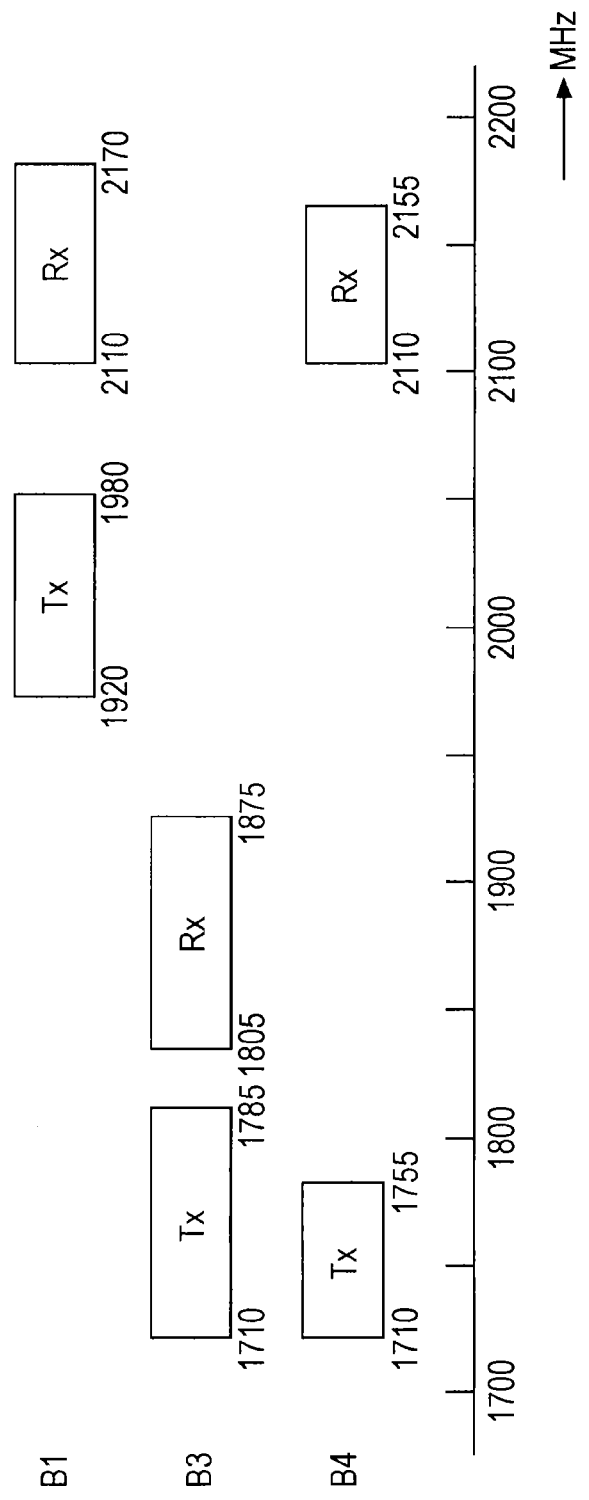
FIG. 1 is a drawing illustrating an example of three band pairs, B1, B3 and B4, as an example of pairs of frequency bands (band pairs) in an FDD system.
Figure 2:
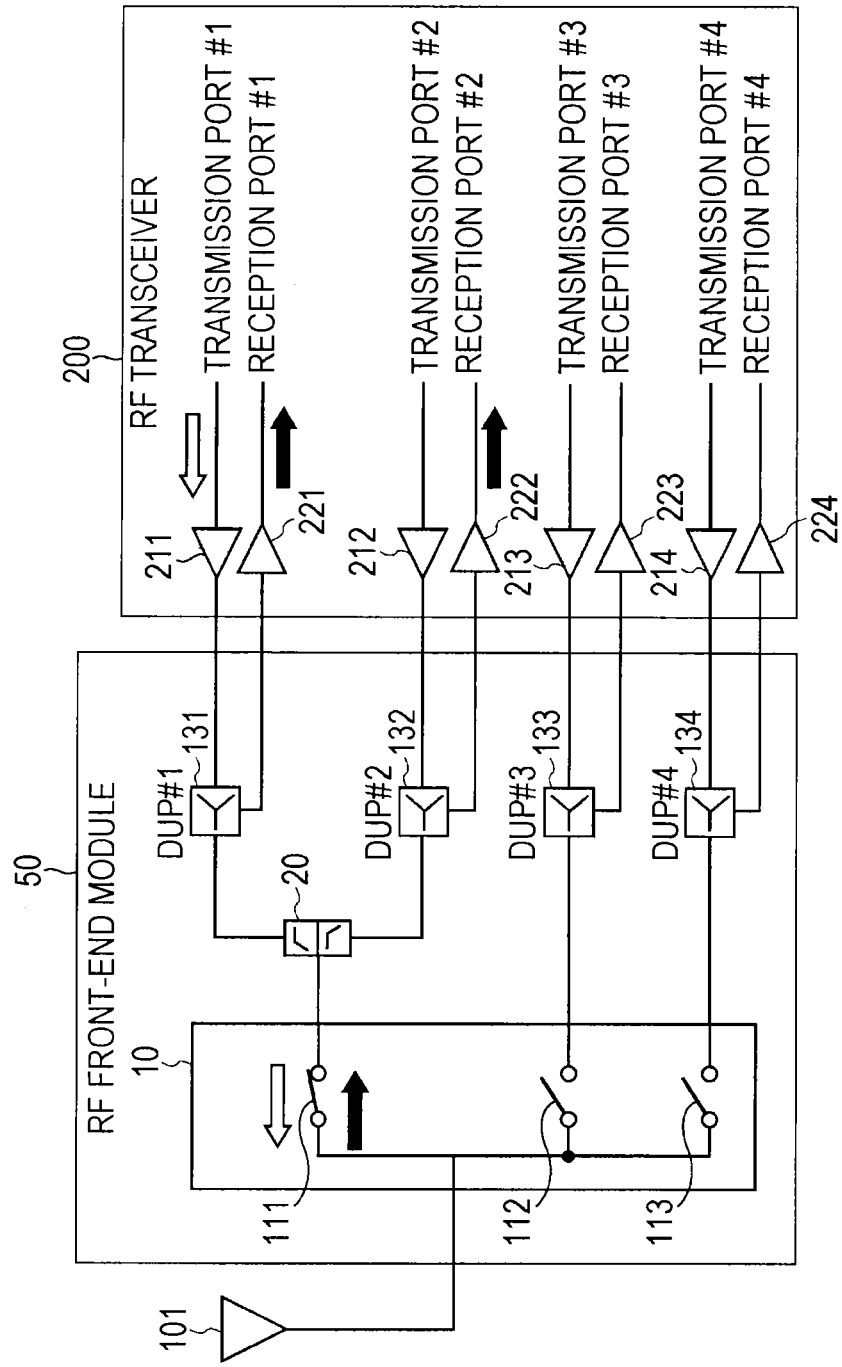
FIG. 2 is a drawing illustrating an example of the structure of an existing RF front-end module that is ready for inter-band carrier aggregation.
Figure 3:
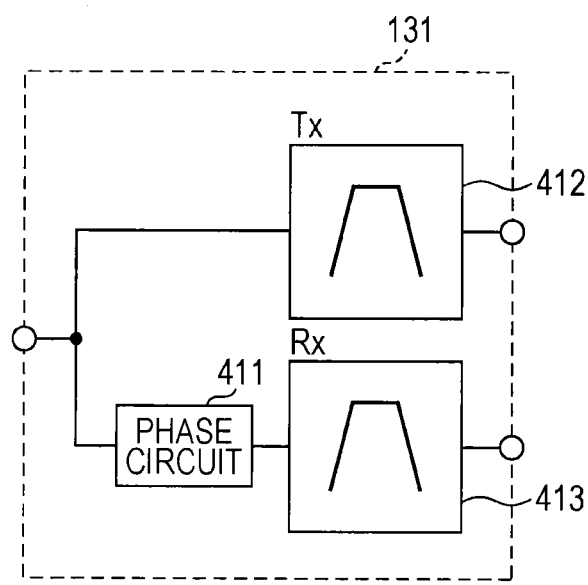
FIG. 3 is a drawing illustrating an example of the structure of an existing duplexer.
Figure 4:
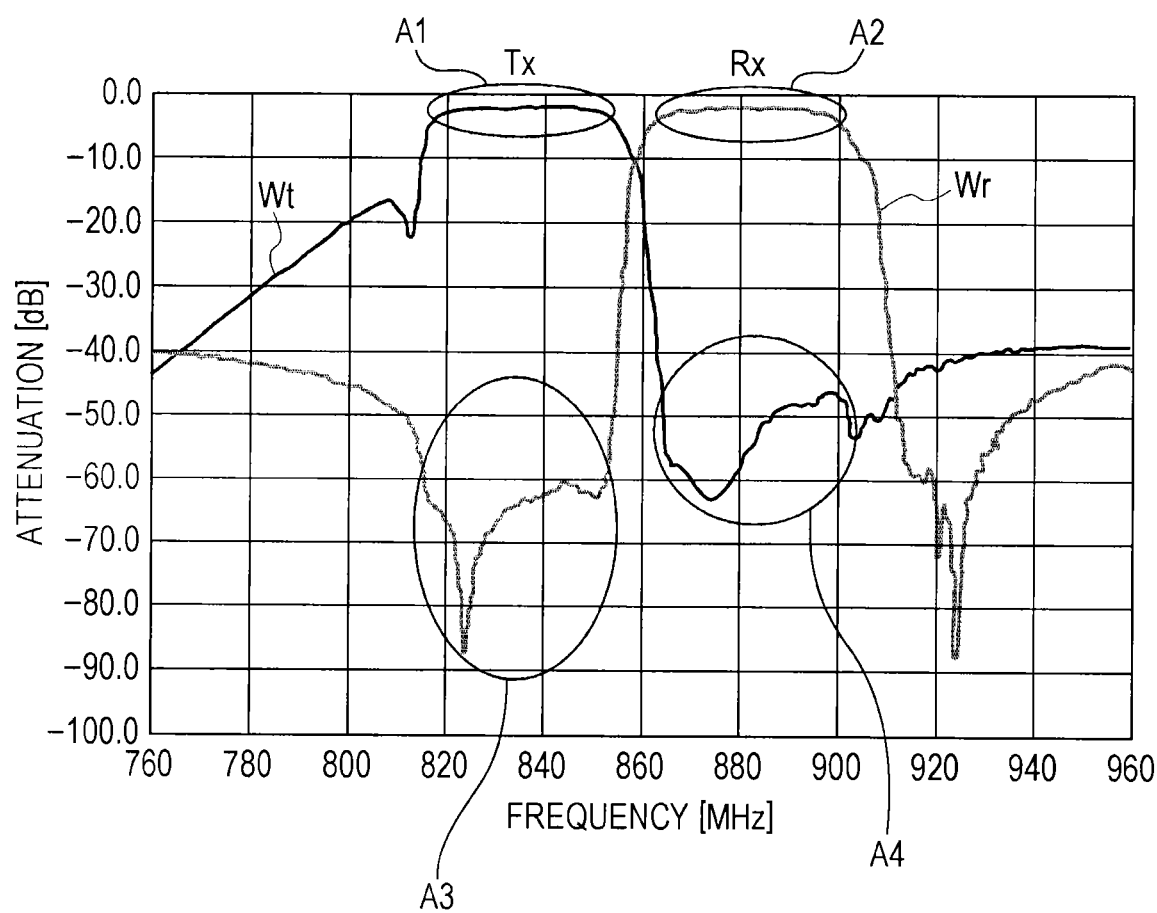
FIG. 4 is a graph used to explain the action of the existing duplexer.

The matching circuit 11 is connected between an antenna terminal (ANT) 60 and one ends of the RF switches 21 and 24. The matching circuit 31 is connected between another end of the RF switch 21 and one end of the duplexer 41. The duplexer 41 has a transmission BPF connected to a B#1 transmission port (B#1Tx) 61 and a reception BPF connected to a B#1 reception port (B#1Rx) 62. As described above with reference to FIG. 3, the duplexer 41 may have a matching circuit connected to at least one of the transmission BPF and reception BPF.

The matching circuit 34 is connected between another end of the RF switch 24 and the B#2 reception BPF 46. The output terminal of the B#2 reception BPF 46 is connected to a B#2 reception port 63 (B#2Rx).

In this embodiment, at least one of the matching circuits 11, 31, and 34 is a variable matching circuit that can perform variable control for its matching constant (that is, impedance).

The RF front-end module 100a has, for example, the following two operation modes that can be mutually switched.

(1) B#1Rx
B#1Tx
(2) B#1Rx+B#2Rx
B#1Tx

In a first operation mode, only the RF switch 21 is turned on and the RF switch 24 is turned off. In a second operation mode, both the RF switches 21 and 24 are turned on. However, the matching constant of at least one of the matching circuits 11, 31, and 34 undergoes switching control according to switching between the first and second operation modes.

With the RF front-end module 100a, at least one matching circuit is controlled so that its matching constant is changed according to operation mode switching in a single band and operation mode switching in inter-band carrier aggregation.

Figure 7A:
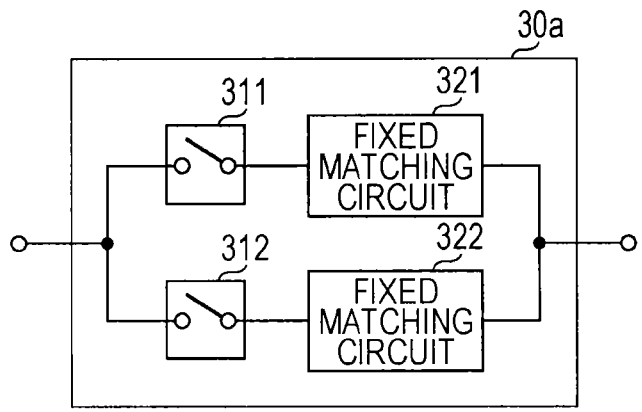
FIGS. 7A-7C are drawings illustrating examples of the structures of variable matching circuits of a first type.
Figure 7B:
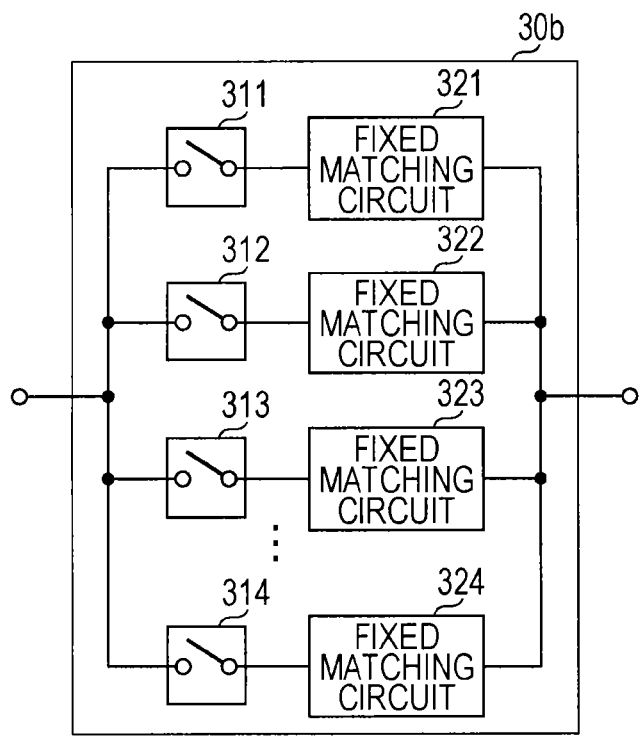
Figure 7C:
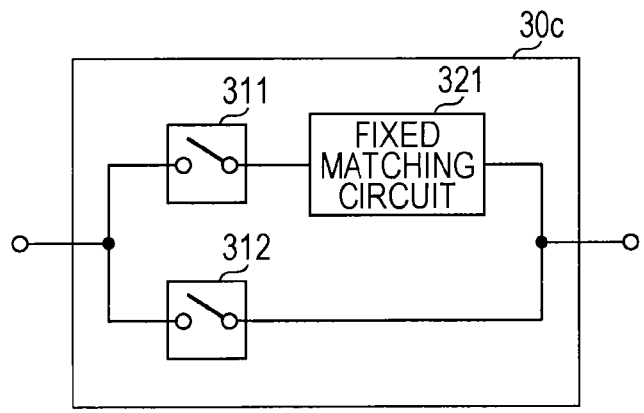

FIGS. 7A, 7B, and 7C illustrate examples of the structures of variable matching circuits 30a, 30b, and 30c of a first type. The first type has a structure in which a plurality of routes are selectively connected or disconnected (turned on or off) with RF switches corresponding to the routes. At least one route includes a fixed matching circuit. This structure enables the matching constant of the variable matching circuit to be made variable. The fixed matching circuit in this description refers to a matching circuit that lacks a switch or a variable element used to externally control the matching constant.

The variable matching circuit 30a illustrated in FIG. 7A is formed by connecting a first route and a second route in parallel, the first rout turning on and off a fixed matching circuit 321 with an RF switch 311 connected in series with the fixed matching circuit 321, the second rout turning on and off a fixed matching circuit 322 with an RF switch 312 connected in series with the fixed matching circuit 322.

The matching circuit 30b illustrated in FIG. 7B has a structure in which three or more routes formed by respectively connecting similar fixed matching circuits 321 to 324 and RF switches 311 to 314 in series are selectively turned on and off by the relevant RF switches.

As with the matching circuit 30c illustrated in FIG. 7C, the structure may be such that part of the plurality of routes lacks its fixed matching circuit.

FIGS. 8A and 8B, and FIGS. 9A and 9B illustrate examples of the structures of variable matching circuits 30d, 30e, 30f, and 30g of a second type. The second type is a so-called shunt-type circuit in which a series route (route between an input terminal and an output terminal) of a variable matching circuit is selectively grounded by a fixed matching circuit.

Figure 8A:
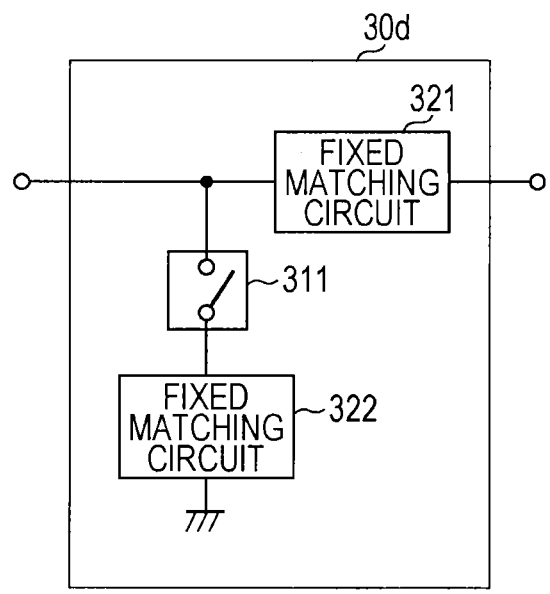
FIGS. 8A and 8B are drawings illustrating examples of the structures of variable matching circuits of a second type.

The variable matching circuit 30d in FIG. 8A has a structure in which a shunt route that selectively grounds the fixed matching circuit 322 with the RF switch 311 is added to a series circuit including the fixed matching circuit 321.

Figure 8B:
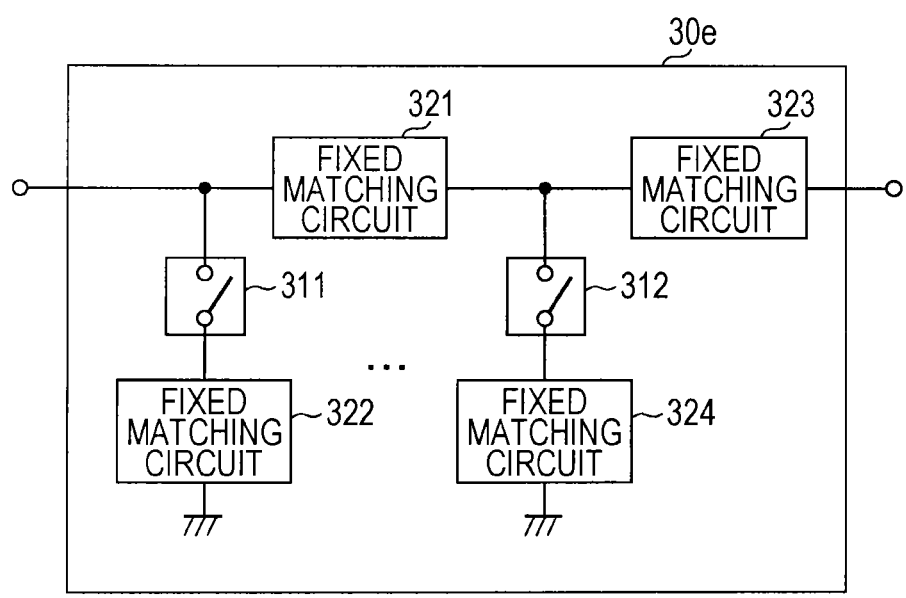

The variable matching circuit 30e in FIG. 8B has a structure in which the structure in FIG. 8A is provided at a plurality of stages (two stages in the drawing) and these structures are connected in series. That is, in the series route, a fixed matching circuit 323 is connected in series with the fixed matching circuit 321. In addition, another one shunt route, on which the RF switch 312 and fixed matching circuit 324 are connected in series, is added between the fixed matching circuits 321 and 323.

Figure 9A:
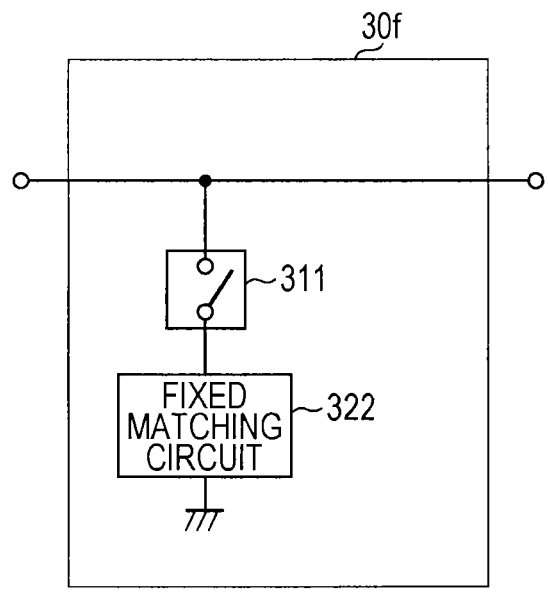
FIGS. 9A and 9B are drawings illustrating examples of the structures of other variable matching circuits of the second type.
Figure 9B:
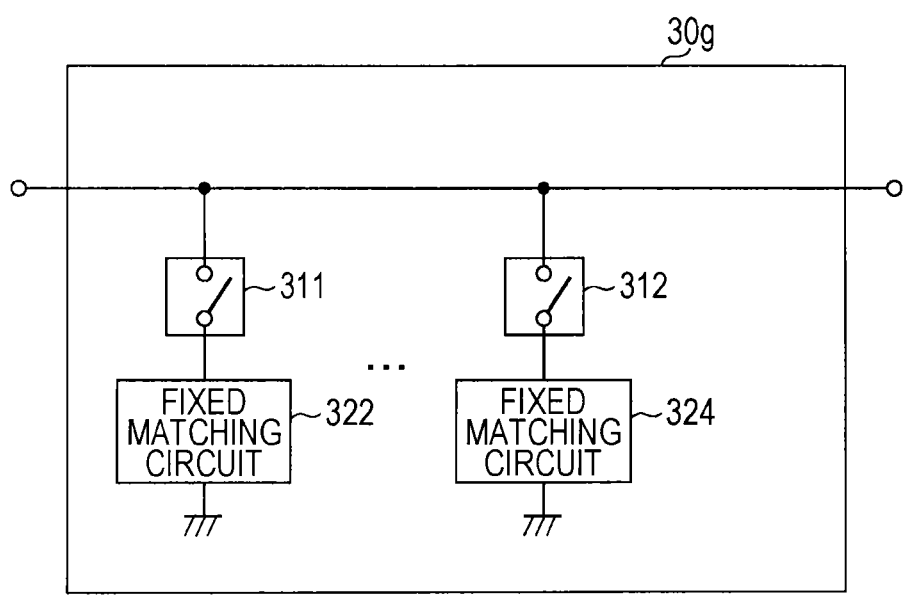

The variable matching circuits 30f and 30g in FIGS. 9A and 9B are variations of the variable matching circuits 30d and 30e in FIGS. 8A and 8B. That is, in the variable matching circuit 30f in FIG. 9A, continuity is simply short-circuited by removing the fixed matching circuit 321 of the variable matching circuit 30d. In the variable matching circuit 30g in FIG. 9B, continuity is simply short-circuited by removing the fixed matching circuits 321 and 323 of the variable matching circuit 30e. Whether to use the fixed matching circuits 321 and 323 is determined according to the structure of the RF font-end module 100, the frequency band used by it, and the like.

FIGS. 10A to 10C and FIGS. 11A to 11C illustrate examples of the structures of variable matching circuits 30h, 30i, 30j, 30k, 30l, and 30m of a third type. The third type uses a variable capacitor on the series route and/or shunt route of the variable matching circuit. Elements that function as a variable capacitor include barium strontium titanate (BST), micro electro mechanical systems (MEMS), diodes, capacitor arrays, and the like.

Figure 10A:
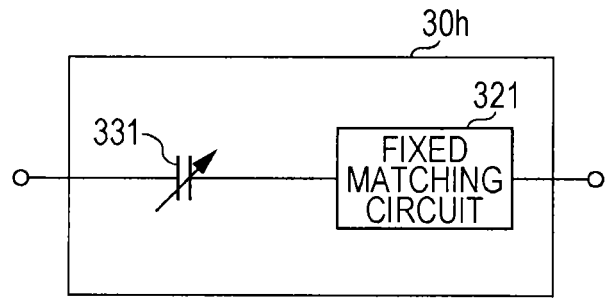
FIGS. 10A-10C are drawings illustrating examples of the structures of variable matching circuits of a third type.

The variable matching circuit 30h in FIG. 10A is a circuit in which a variable capacitor 331 is connected in series with the fixed matching circuit 321. The variable capacitor 331 is an element that can perform variable control for its capacitance with a control signal from the base-band processing unit 300.

Figure 10B:
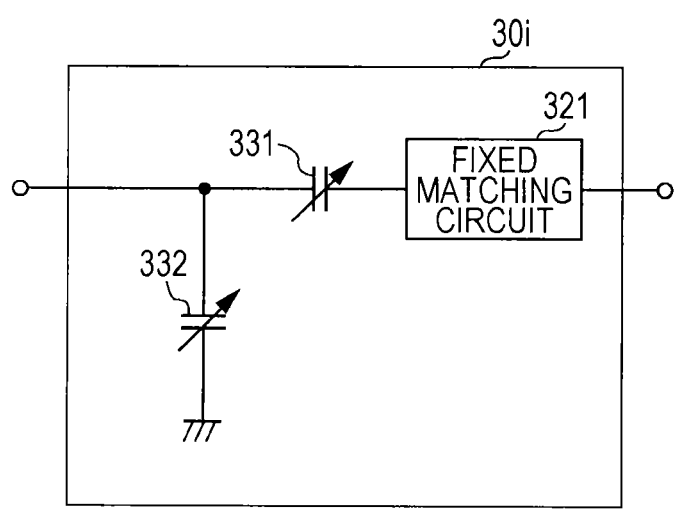

The variable matching circuit 30i in FIG. 10B is a circuit in which another one variable capacitor 332 is added besides the variable capacitor 331 in the variable matching circuit 30h in FIG. 10A, the variable capacitor 332 being shunt-connected between its one end and the ground.

Figure 10C:
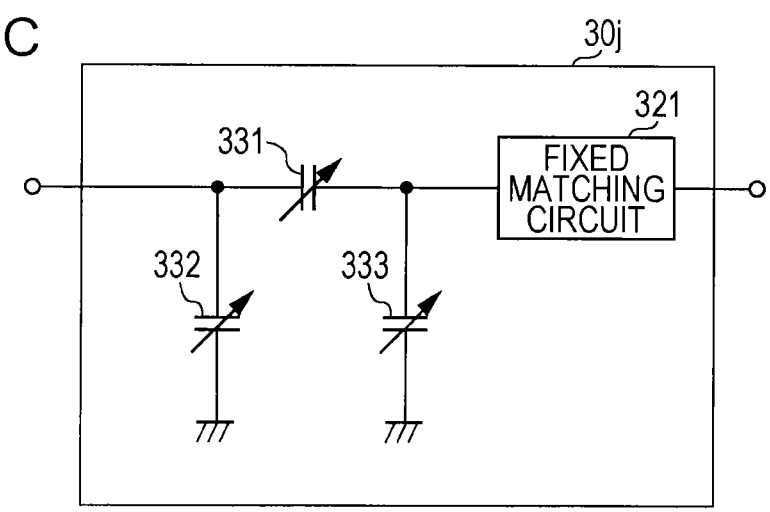

The variable matching circuit 30j in FIG. 10C is a circuit in which the variable capacitor 332 and a variable capacitor 333 are shunt-connected between both ends of the variable capacitor 331 and the ground in the variable matching circuit 30i.

Figure 11A:
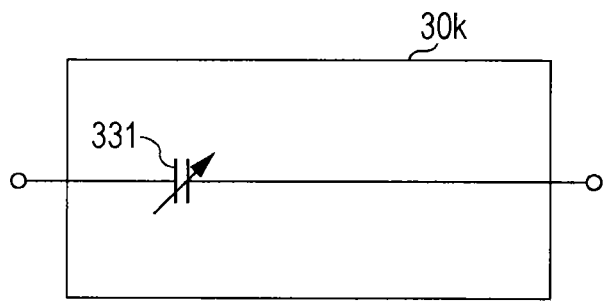
FIGS. 11A-11C are drawings illustrating examples of the structures of other variable matching circuits of a third type.
Figure 11B:
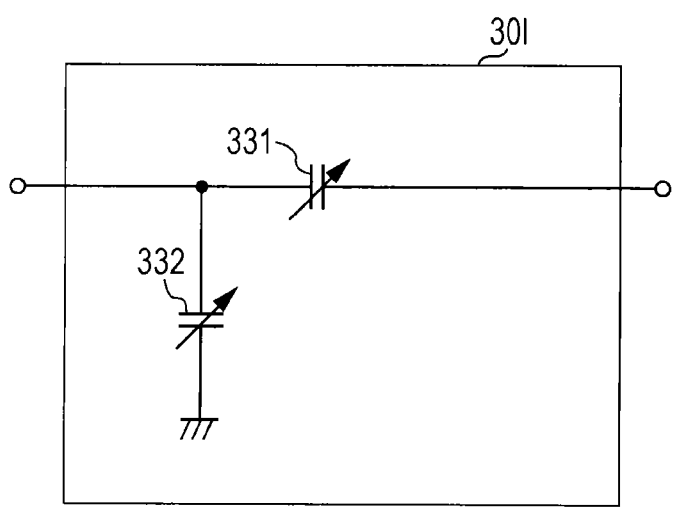
Figure 11C:
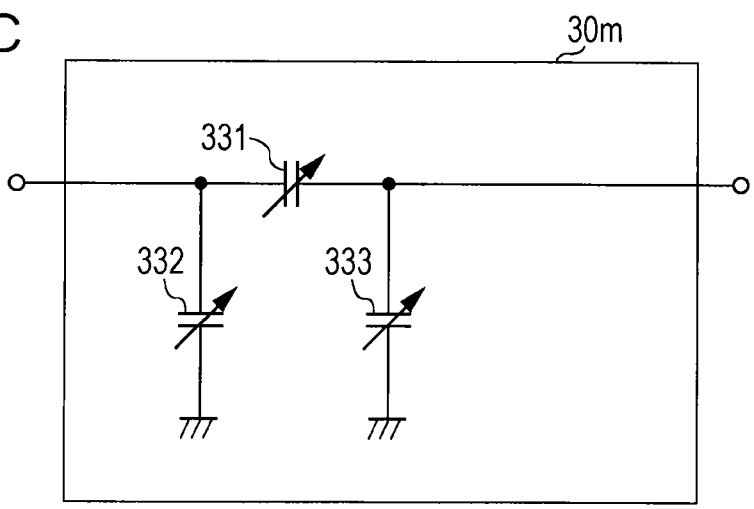

FIGS. 11A to 11C illustrate variations of the variable matching circuits 30h, 30i, and 30j illustrated in FIGS. 10A to 10C. That is, in the variable matching circuits 30k, 30l, and 30m in FIGS. 11A to 11C, continuity is simply short-circuited by removing the fixed matching circuit 321 of the variable matching circuits 30h, 30i, and 30j, respectively.

Figure 12:
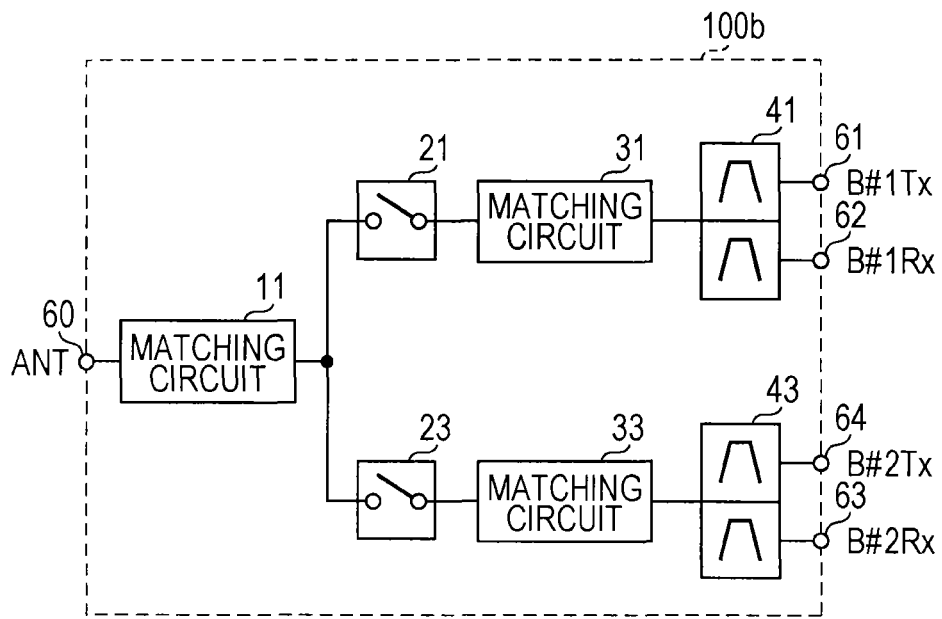
FIG. 12 is a drawing illustrating the structure of an RF front-end module in a second embodiment of the present disclosure.

Next, FIG. 12 illustrates the structure of an RF front-end module 100b in a second embodiment. Elements similar to elements of the RF front-end module 100a illustrated in FIG. 6 are assigned identical reference numerals. The RF front-end module 100b differs from the RF front-end module 100a in that a duplexer 43 is used instead of the BPF 46.

As with the duplexer 41, the duplexer 43 includes a transmission BPF connected to a B#2 transmission port (B#2Tx) 64 and a reception BPF connected to a B#2 reception port (B#2Rx) 63.

One end of the RF switch 23 is connected to another end of the matching circuit 11. A matching circuit 33 is connected between another end of the RF switch 23 and the duplexer 43.

The RF front-end module 100b has, for example, the following five operation modes that can be mutually switched.
(1) B#1Rx
B#1Tx
(2) B#2Rx
B#2Tx
(3) B#1Rx+B#2Rx
B#1Tx
(4) B#1Rx+B#2Rx
B#2Tx
(5) B#1Rx+B#2Rx
B#1Tx+B#2Tx In a first operation mode, only the RF switch 21 is turned on and the RF switch 23 is turned off. In a second operation mode, only the RF switch 23 is turned on and the RF switch 21 is turned off. In third, fourth, and fifth operation modes, both the RF switches 21 and 23 are turned on. However, at least one of the matching circuits 11, 31, and 33 is a variable matching circuit having any one of the structures described above, and its matching constant undergoes switching control according to switching among the first to fifth operation modes.

Figure 13:
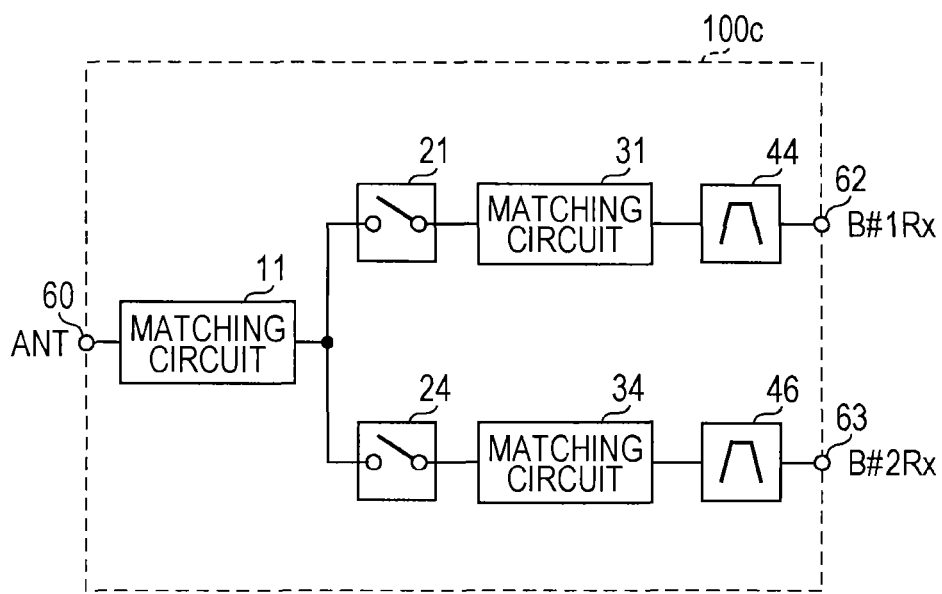
FIG. 13 is a drawing illustrating the structure of an RF front-end module in a third embodiment of the present disclosure.

FIG. 13 illustrates the structure of an RF front-end module 100c in a third embodiment. Elements similar to elements of the RF front-end module 100a illustrated in FIG. 6 are assigned identical reference numerals. The RF front-end module 100c differs from the RF front-end module 100a in that a reception BPF 44 (B#1Rx) is used instead of the duplexer 41. The RF front-end module 100c lacks a transmission BPF and can be used in applications such as, for example, reception diversity.

The RF front-end module 100c has, for example, the following three operation modes that can be mutually switched.
(1) B#1Rx
(2) B#2Rx
(3) B#1Rx+B#2Rx In a first operation mode, only the RF switch 21 is turned on and the RF switch 24 is turned off. In a second operation mode, only the RF switch 24 is turned on and the RF switch 21 is turned off. In a third operation mode, both the RF switches 21 and 24 are turned on. However, at least one of the matching circuits 11, 31, and 34 is a variable matching circuit, and its matching constant undergoes switching control according to switching between the first, second, and third operation modes.

Figure 14:
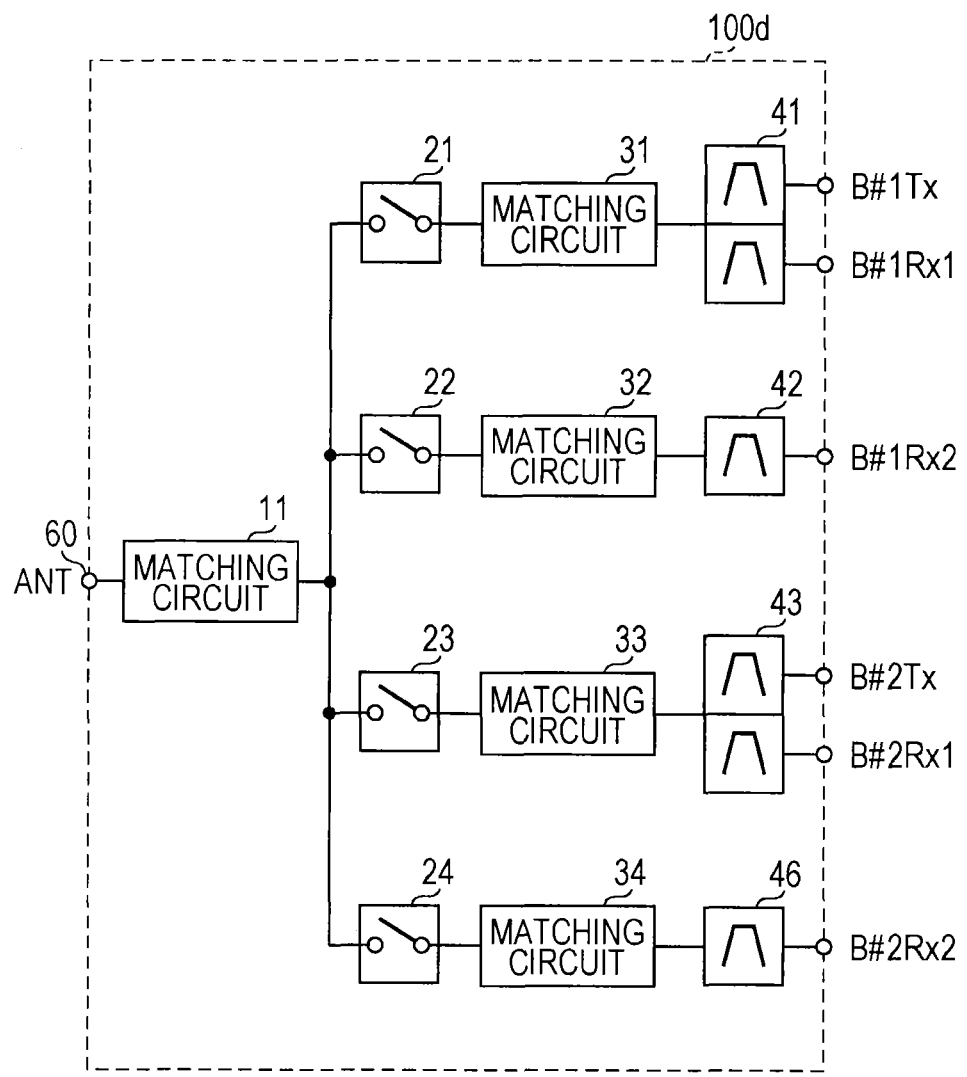
FIG. 14 is a drawing illustrating the structure of an RF front-end module in a fourth embodiment of the present disclosure.

Next, FIG. 14 illustrates the structure of an RF front-end module 100d in a fourth embodiment. Elements similar to elements of the RF front-end module 100b illustrated in FIG. 12 are assigned identical reference numerals. The RF front-end module 100d differs from the RF front-end module 100b in the following points.

That is, as the reception BPF of the first band B#1, a second reception BPF 42 is redundantly provided besides the duplexer 41 including the reception BPF connected to the B#1Rx 1 port. An RF switch 22 and a matching circuit 32 are connected in series between the reception BPF 42 and the matching circuit 11. The output end of the reception BPF 42 is a B#1Rx2 port.

Similarly, as the reception BPF of the second band B#2, a second reception BPF 46 is provided besides the duplexer 43 including the reception BPF connected to the B#2Rx1 port.

The RF switch 24 and matching circuit 34 are connected in series between the reception BPF 46 and the matching circuit 11. The output end of the reception BPF 46 is a B#2Rx2 port.

Figure 15A:
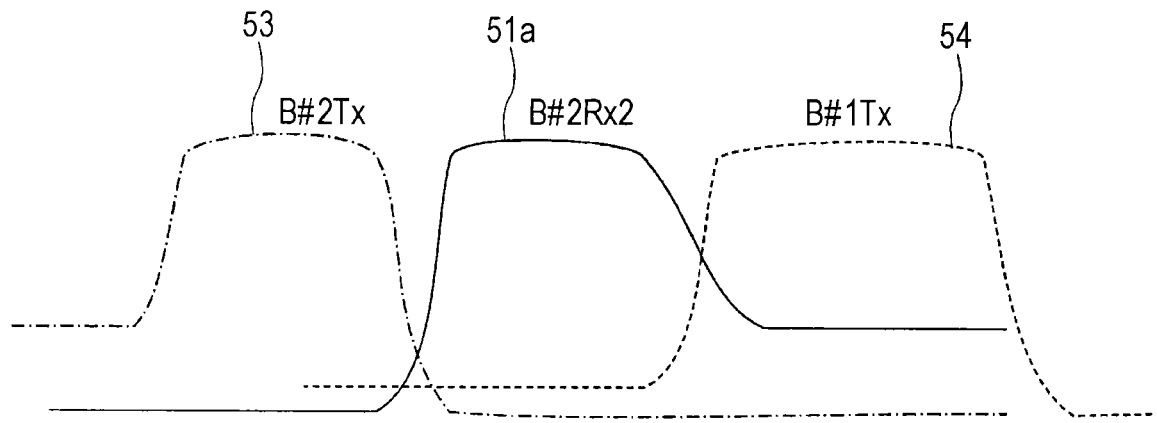
FIGS. 15A and 15B are each a graph used to explain the fourth embodiment.
Figure 15B:
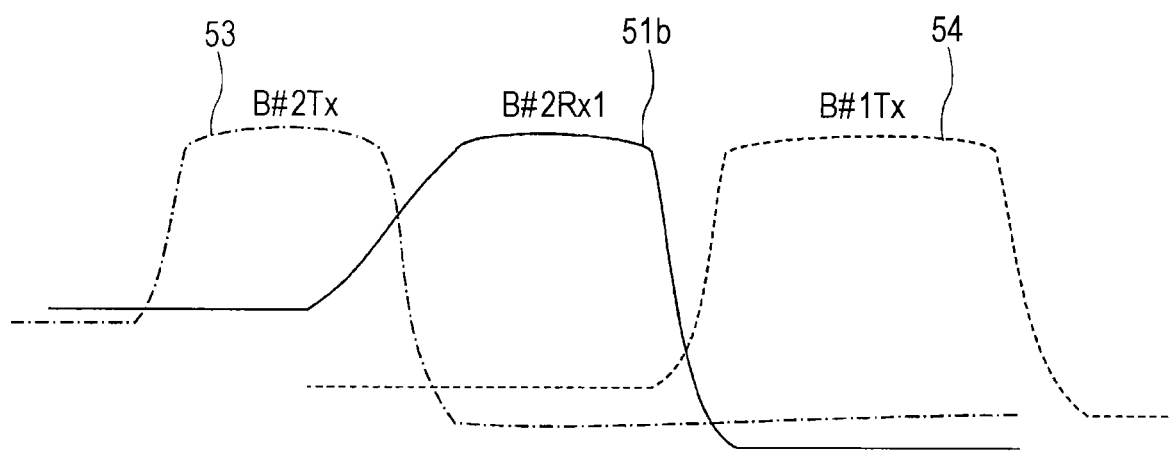

In this embodiment, a plurality of BPFs (for, for example, reception) in a certain frequency band are redundantly prepared. If, in inter-band carrier aggregation, a certain frequency band is used by being selectively combined with any one of a plurality of other frequency bands, any one of the plurality of prepared BPFs is selectively used according to the frequency band to be combined. As illustrated in FIGS. 15A and 15B, the waveform of a cutoff on a boundary between the passband of each band pass filter and its outer band is not always abrupt, and its upper and lower cutoffs may have different waveforms. Thus, band pass filters that have the same passband but have different attenuation characteristics between their upper and lower cutoffs are prepared, and a reception band bass filter is selectively used according to the transmission frequency band to be used. If, for example, B#2Rx1 (51b) and B#2Rx2 (51a) are provided as reception BPFs of B#2 and B#2Tx is combined as illustrated in FIG. 15A, B#2Rx2 is selected. If B#2Rx is used in combination with B#1Tx as illustrated in FIG. 15B, B#2Rx1 is selected.

The RF front-end module 100d has, for example, the following four operation modes that can be mutually switched.
(1) B#1Rx1
B#1Tx
(2) B#2Rx2
B#2Tx
(3) B#1Rx1+B#2Rx1
B#1Tx
(4) B#1Rx2+B#2Rx2
B#2Tx In a first operation mode, only the RF switch 21 is turned on and the other RF switches are turned off. In a second operation mode, only the RF switch 23 is turned on and the other RF switches are turned off. In a third operation mode, the RF switches 21 and 22 are turned on and the other RF switches are turned off. In a fourth operation mode, the RF switches 23 and 24 are turned on and the other RF switches are turned off. However, at least one of the matching circuits 11 and 31 to 34 is a variable matching circuit, and its matching constant undergoes switching control according to switching among these operation modes.

Figure 16:
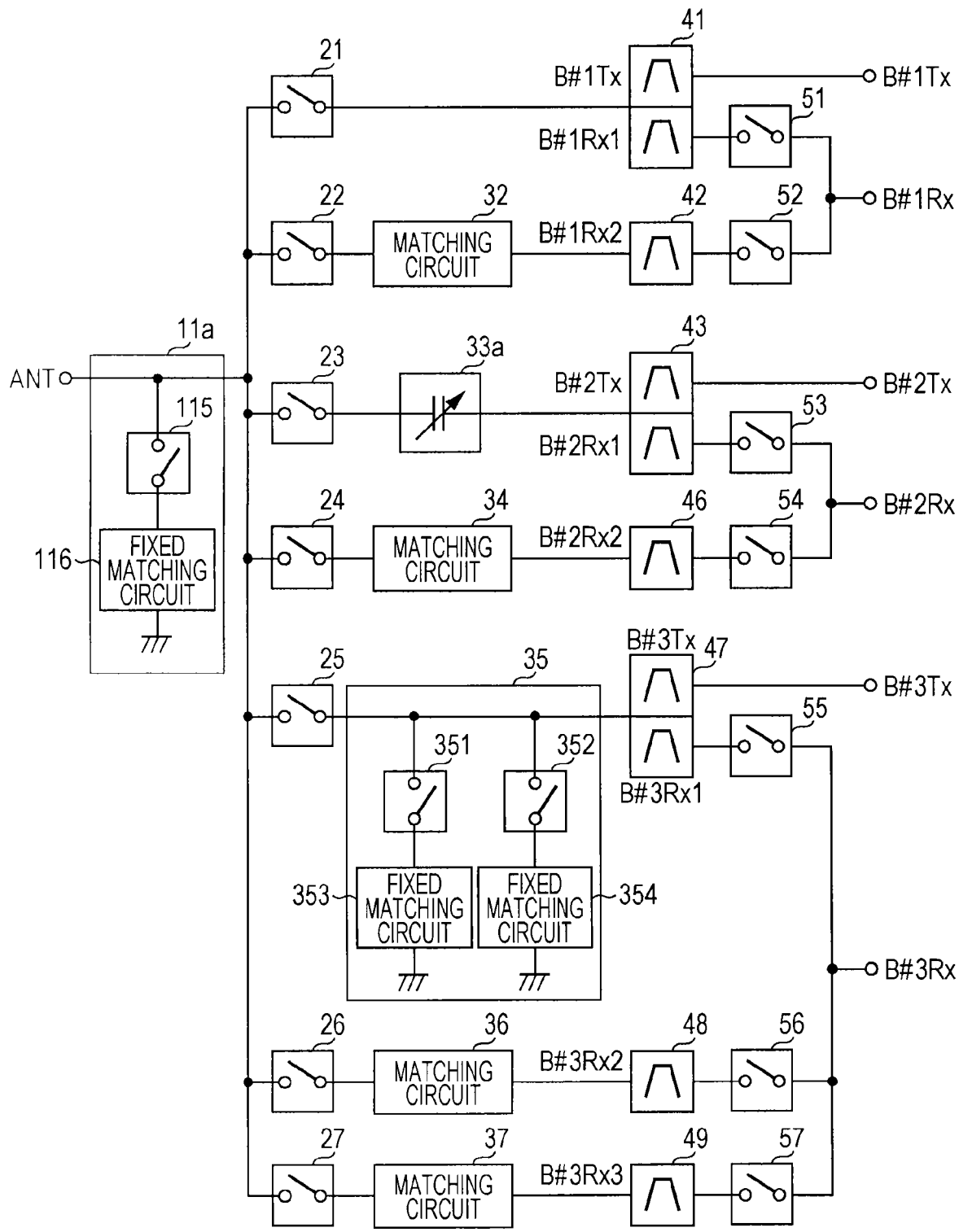
FIG. 16 is a drawing illustrating a specific structural example of an RF front-end module having a more complex structure.

FIG. 16 illustrates a specific structural example of an RF front-end module 100e having a more complex structure. Elements similar to elements of the RF front-end module 100d illustrated in FIG. 14 are assigned identical reference numerals.

In this inter-band carrier aggregation, three frequency bands, B#1, B#2, and B#3, are used. The matching circuit 11 is a variable matching circuit 11a that selectively grounds a fixed matching circuit 116 by using an RF switch 115 with respect to an antenna terminal ANT.

The RF front-end module 100e further has a duplexer 47 including a transmission BPF (B#3Tx) and reception BPF (B#3Rx1) for B#3 and second and third reception BPFs 48 and 49 for B#3. An RF switch 25 and a variable matching circuit 35 are connected in series between the duplexer 47 and the variable matching circuit 11a. The matching circuits 35 includes a shunt circuit that selectively grounds a fixed matching circuit 353 by using an RF switch 351 with respect to the route to the RF switch 25 and a shunt circuit that selectively grounds a fixed matching circuit 354 by using an RF switch 352 with respect to the rout to the RF switch 25.

An RF switch 26 and a matching circuit 36 are connected in series between the reception BPF 48 (B#3Rx2) and the variable matching circuit 11a. An RF switch 27 and a matching circuit 37 are connected in series between the reception BPF 49 (B#3Rx3) and the matching circuit 11a.

The output end of the reception BPF (B#1Rx1) of the duplexer 41 is connected through an RF switch 51 to a B#1Rx reception port. The output end of the reception BPF 42 (B#1Rx2) is connected through an RF switch 52 to the B#1Rx reception port.

The output end of the reception BPF (B#2Rx1) of the duplexer 43 is connected through an RF switch 53 to a B#2Rx reception port. The output end of the reception BPF 46 (B#2Rx2) is connected through an RF switch 54 to the B#2Rx reception port.

The output end of the reception BPF (B#3Rx1) of the duplexer 47 is connected through an RF switch 55 to a B#3Rx reception port. The output end of the reception BPF 48 (B#3Rx2) is connected through an RF switch 56 to the B#3Rx reception port. The output end of the reception BPF 49 (B#3Rx3) is connected through an RF switch 57 to the B#3Rx reception port.

The reception BPF (B#3Rx1) of the duplexer 47 is used together with the transmission BPF (B#3Tx) for B#3. The reception BPF 48 (B#3Rx2) is used together with the transmission BPF (B#1Tx) for B#1. The reception BPF 49 (B#3Rx3) is used together with the transmission BPF (B#2Tx) for B#2.

In the example of the RF front-end module 100e, the matching circuits 11a, 33a, and 35 are variable matching circuits, and other matching circuits are fixed matching circuits. The variable matching circuits are not limited to those illustrated in the drawing; any of the various structures described above can be used.

Although, in the example illustrated in FIG. 16, a matching circuit for the duplexer 41 is omitted (or a matching circuit with continuity short-circuited is used), the matching circuit may be included.

A plurality of operation modes of the RF front-end module 100e are, for example, as follows.
(1) B#1Rx1
B#1Tx
(2) B#2Rx1
B#2Tx
(3) B#3Rx1
B#3Tx
(4) B#1Rx1+B#2Rx1
B#1Tx or B#2Tx or (B#1Tx+B#2Tx)
(5) B#1Rx1+B#3Rx2
B#1Tx
(6) B#2Rx1+B#3Rx3
B#2Tx
(7) B#1Rx2+B#3Rx1
B#3Tx
(8) B#2Rx2+B#3Rx1
B#3Tx FIG. 17 represents combinations of the above plurality of operation modes of the RF front-end module 100e in FIG. 16 and the states of various RF switches and the matching circuit (variable capacitor) 33a, which implement these operation modes. The last operation mode #9 in FIG. 17 represents a case in which none of all frequencies are used.

An example of operation of a mobile wireless terminal having an RF front-end module in this embodiment will be described with reference to the flowchart in FIG. 18 by using the RF front-end module 100e illustrated in FIG. 16 as an example. An example will be described below in which the mobile wireless terminal operates by selectively switching between a first operation mode (#1) and a fourth operation mode (#4) indicated in FIG. 17 in response to a command from a base station. The first operation mode in this example is an operation mode to perform transmission and reception in a single band of B#1. The fourth operation mode is an operation mode to perform inter-band carrier aggregation in which B#1 is used for transmission and reception between the terminal and the base station and B#2 is additionally used in reception.

In the flowchart in FIG. 18, the mobile wireless terminal is initially connected wirelessly to the base station in B#1 and performs communication (transmission and reception) in a single band of B#1. Therefore, the base-band processing unit 300 (FIG. 5) turns on the RF switches SW21, SW26, and SW51 and turns off the other RF switches (S1). The variable capacitor 33a has at least a state 0 and a state 1 in which its capacitance differs; the state 0 is taken in this step.

Then, if a command for additional connection in B#2 is received from the base station (Yes in S2), the base-band processing unit 300 additionally turns on the RF switches SW23 and SW53, turns off SW26, and changes the variable capacitor 33a from the state 0 to the state 1 (S3).

Accordingly, communication with the base station is performed in inter-band carrier aggregation in which B#1 is used for transmission and reception and B#2 is used only for reception (S4). At this time, the RF switches SW21, 23, 51, and 53 are turned on, the other RF switches are turned off, and the variable capacitor 33a is in the state 1.

Then, if a command to disconnect the connection in B#2 is received from the base station (Yes in S5), the base-band processing unit 300 turns off the RF switches SW23 and SW53, turns on SW26, and returns the variable capacitor 33a from the state 1 to the state 0 (S6).

Then, a wireless connection to the base station is established in B#1 and communication (transmission and reception) is performed in a single band of B#1 (S7). At this time, the RF switches SW21, SW26, and SW51 are turned on, the other RF switches are turned off, and the variable capacitor 33a is in the state 0. In this state, monitoring in step S2 above is performed.

As described above, each time a command to add or delete a frequency band to be used is received from the base station, a reception band pass filter in a commanded frequency band, and RF switches and a specified variable matching circuit are controlled. Thus, a reception frequency band can be selectively added while a wireless connection in a frequency band in use in transmission and reception is stably continued.

Although only an example in which switching is performed between the first and fourth operation modes to use the mobile wireless terminal has been described here, it is also possible to operate the mobile wireless terminal by combining other operation modes or combining three or more operation modes. Although a flowchart has been illustrated only for the RF front-end module 100e in FIG. 16, control of switching between two or more operation modes is similarly possible for the structures of other RF front-end modules as well.

Although preferred embodiments of the present disclosure have been described, various variations and modifications can be made besides those described above. That is, it will be understood by those skilled in the art that various modification and combinations and other embodiments may be derived from design or other elements within the range of the claims or an equivalent range of the claims.

In an embodiment in which a duplexer is used, for example, a transmission BPF and a reception BPF (and a necessary phase circuit) may be used instead of the duplexer.

The invention claimed is:

1. An electronic device comprising:
a first reception band pass filter having a first reception frequency set as a passband;
a second reception band pass filter having a second reception frequency set as a passband;
a first matching circuit having a first end connected to an antenna terminal;
a first switch having a first end connected to a second end of the first matching circuit:
a second switch having a first end connected to the second end of the first matching circuit;
a second matching circuit connected between a second end of the first switch and the first reception band pass filter; and
a third matching circuit connected between a second end of the second switch and the second reception band pass filter, wherein
at least one of the first, second, and third matching circuits is a variable matching circuit having a controllable matching constant.

2. The electronic device of claim 1, wherein
the variable matching circuit includes a plurality of parallel paths.

3. The electronic device of claim 2, wherein
each parallel path of the variable matching circuit includes a switch connected to an input end of the variable matching circuit and a fixed matching circuit having an input end connected to an output end of the switch and an output end connected to an output end of the variable matching circuit.

4. The electronic device of claim 2, wherein
a first of the parallel paths includes a first switch connected to an input end of the variable matching circuit and a fixed matching circuit having an input end connected to an output end of the switch and an output end connected to an output end of the variable matching circuit, and
a second of the parallel paths includes a second switch directly connected between the input end of the variable matching circuit and the output end of the variable matching circuit.

5. The electronic device of claim 1, wherein
the variable matching circuit includes a first fixed matching circuit connected between an input of the variable matching circuit and an output of the variable matching circuit and a shunt route connected to the input end of the variable matching circuit.

6. The electronic device of claim 5, wherein
the shunt route includes a switch having a first end connected to the input end of the variable matching circuit and a second end connected to an input end of a second fixed matching circuit.

7. The electronic device of claim 6, wherein
an output end of the fixed matching circuit is connected to ground.

8. The electronic device of claim 1, wherein
the variable matching circuit includes first and second fixed matching circuits connected in series between an input of the variable matching circuit and an output of the variable matching circuit.

9. The electronic device of claim 8, wherein
the variable matching circuit includes a first shunt route having a first switch and a third fixed matching circuit connected in series between the input end of the variable matching circuit and ground.

10. The electronic device of claim 9, wherein
the variable matching circuit includes a second shunt route having a second switch and a fourth fixed matching circuit connected in series between an output end of the first fixed matching circuit and an input end of the second fixed matching circuit and ground.

11. The electronic device of claim 1, wherein
the variable matching circuit includes a first switch having a first end connected to an input end of the variable matching circuit and an output end of the variable matching circuit, and a first fixed matching circuit having an input end connected to a second end of the first switch and an output end connected to ground.

12. The electronic device of claim 11, wherein
the variable matching circuit includes a second switch having a first end connected to an input end of the variable matching circuit and an output end of the variable matching circuit, and a second fixed matching circuit having an input end connected to a second end of the second switch and an output end connected to ground.

13. The electronic device of claim 1, wherein
the variable matching circuit includes a first variable capacitor and a fixed matching circuit connected in series between an input end of the variable matching circuit and an output end of the variable matching circuit.

14. The electronic device of claim 13, wherein
the variable matching circuit includes a second variable capacitor having a first end connected to the input end of the variable matching circuit and a second end connected to ground.

15. The electronic device of claim 14, wherein
the variable matching circuit includes a third variable capacitor having a first end connected between the first variable capacitor and an input end of the fixed matching circuit and a second end connected to ground.

16. The electronic device of claim 1, wherein
the variable matching circuit includes a first variable capacitor connected in series between an input end of the variable matching circuit and an output end of the variable matching circuit.

17. The electronic device of claim 16, wherein
the variable matching circuit includes a second variable capacitor having a first end connected between the input end of the variable matching circuit and the first variable capacitor and a second end connected to ground.

18. The electronic device of claim 17, wherein
the variable matching circuit includes a third variable capacitor having a first end connected between the output end of the variable matching circuit and the first variable capacitor and a second end connected to ground.

19. The electronic device of claim 1, further comprising:
a duplexer that includes the first reception band pass filter and a first transmission band pass filter having a first transmission frequency band set as a passband.

20. The electronic device of claim 19, further comprising:
a second duplexer including the second reception band pass filter and a second transmission band pass filter having a second transmission frequency band set as a passband.

21. An electronic device comprising:
a radio frequency (RF) frontend module connected to an antenna;
an RF transceiver connected to the RF frontend module and having a transmission circuit and a reception circuit; and
baseband circuitry connected to the RF transceiver and configured to perform baseband processing, wherein
the RF frontend module comprises
a first reception band pass filter having a first reception frequency set as a passband;
a second reception band pass filter having a second reception frequency set as a passband;
a first matching circuit having a first end connected to an antenna terminal;
a first switch having a first end connected to a second end of the first matching circuit:
a second switch having a first end connected to the second end of the first matching circuit;
a second matching circuit connected between a second end of the first switch and the first reception band pass filter; and
a third matching circuit connected between a second end of the second switch and the second reception band pass filter, wherein
at least one of the first, second, and third matching circuits is a variable matching circuit having a controllable matching constant, and
the baseband circuitry is configured to operate the RF frontend module in any one of a first operation mode in which the first switch is turned on and the second switch is turned off, a second operation mode in which the second switch is turned on and the first switch is turned off, and a third operation mode in which both the first and second switches are turned on, and control the variable matching circuit according to switching among the operation modes.

22. An electronic device comprising:
a radio frequency (RF) frontend module that is connected to an antenna;
an RF transceiver connected to the RF frontend module and having a transmission circuit and a reception circuit; and
baseband processing circuitry connected to the RF transceiver and configured to perform baseband processing, wherein
the RF frontend module comprises
a duplexer that includes a first reception band pass filter having a first reception frequency band set as a passband and a first transmission band pass filter having a first transmission frequency band set as a passband,
a second reception band pass filter having a second reception frequency set as a passband;
a first matching circuit having a first end connected to an antenna terminal;
a first switch having a first end connected to a second end of the first matching circuit:
a second switch having a first end connected to the second end of the first matching circuit;
a second matching circuit connected between a second end of the first switch and the first reception band pass filter; and
a third matching circuit connected between a second end of the second switch and the second reception band pass filter, wherein
at least one of the first, second, and third matching circuits is a variable matching circuit having a controllable matching constant, and
the baseband processing circuitry is configured to operate the RF frontend module in any one of a first operation mode in which the first switch is turned on and the second switch is turned off and a second operation mode in which both the first and second switches are turned on, and control the variable matching circuit according to switching among the operation modes.

* * * * *